United States Patent [19]
Fuesser et al.

[11] Patent Number: 5,737,186
[45] Date of Patent: Apr. 7, 1998

[54] ARRANGEMENT OF PLURAL MICRO-COOLING DEVICES WITH ELECTRONIC COMPONENTS

[75] Inventors: Hans-Juergen Fuesser, Gerstetten-Dettingen; Reinhard Zachai, Guenzburg; Wolfram Muench, Mannheim; Tim Gutheit, Ulm, all of Germany

[73] Assignee: Daimler-Benz AG, Stuttgart, Germany

[21] Appl. No.: 639,102

[22] Filed: Apr. 22, 1996

[30] Foreign Application Priority Data

Apr. 20, 1995 [DE] Germany .................. 195 14 545.3

[51] Int. Cl.$^6$ ............................................... H05K 7/20
[52] U.S. Cl. ..................... 361/699; 165/80.4; 257/714; 361/704; 361/713
[58] Field of Search ............................. 165/80.2, 80.4, 165/185; 257/714; 361/688–690, 698–699, 704, 707, 712, 715–722

[56] References Cited

U.S. PATENT DOCUMENTS

| | | | |
|---|---|---|---|
| 3,648,113 | 3/1972 | Rathjen et al. ................... | 361/689 |
| 4,186,422 | 1/1980 | Laermer ............................ | 361/689 |
| 4,839,702 | 6/1989 | Grinberg et al. . | |
| 5,034,852 | 7/1991 | Rosenberg ........................ | 361/707 |
| 5,117,267 | 5/1992 | Komoto et al. . | |
| 5,146,314 | 9/1992 | Pankove .......................... | 361/689 |
| 5,170,319 | 12/1992 | Chu et al. ........................ | 361/699 |
| 5,424,916 | 6/1995 | Martin ............................. | 361/698 |
| 5,586,004 | 12/1996 | Green et al. ..................... | 361/715 |

FOREIGN PATENT DOCUMENTS 4311839  10/1994  Germany .

*Primary Examiner*—Gregory D. Thompson
*Attorney, Agent, or Firm*—Evenson, McKeown, Edwards & Lenahan P.L.L.C.

[57] ABSTRACT

An arrangement of a plurality of microcooling devices provided with electrical components, each microcooling device having a closed channel structure for a coolant to flow through, and being provided with electrical conductors for the electronic components and with externally carried fluid ducts for a coolant which flows through the channel structures. A covering layer which forms one of at least two flat sides of the microcooling device is made from an electrically insulating material with good heat conductivity. The electronic components are arrayed on this cover layer and on the opposite flat side of each microcooling device. Adjacent microcooling devices which are provided with electronic components on confronting flat sides are arranged with their components spaced apart or staggered with respect to one another, and the components of one microcooling device preferably are in contact with the cover layer of the adjacent microcooling device.

13 Claims, 1 Drawing Sheet

ARRANGEMENT OF PLURAL MICRO-COOLING DEVICES WITH ELECTRONIC COMPONENTS

BACKGROUND OF THE INVENTION

This invention relates to an arrangement of a plurality of microcooling devices provided with electronic components, each microcooling device comprising a closed channel through which a coolant passes.

Published German Patent Application No. DE 4,311,839 discloses microcooling devices which are suitable for the accommodation of electronic components. As used herein, the term "microelectronic components" is understood to refer to diodes, transistors, thyristors and the like, capacitive and inductive as well as parasitic and superconducting electronic elements, as well as circuits made with such components. Particularly in the fields of computer technology and electronic data processing, it is often desired to dispose electronic components within a housing in a space-saving manner. In compact arrangements of this type, there is always the problem that the dissipative heat produced during operation of the electronic components must be eliminated.

SUMMARY OF THE INVENTION

The object of the invention is to provide an improved compact microcooling arrangement.

It is also an object of the invention to provide a microcooling arrangement which enables electronic components and/or assemblies to be arranged within a housing in a denser, space-saving manner.

These and other objects have been achieved in accordance with the present invention by providing a microcooling arrangement comprising a plurality of adjacent microcooling devices each provided with at least one electronic component, each microcooling device having two opposed flat sides and comprising a closed channel structure through which a coolant passes, outwardly extending fluid lines for respectively supplying and carrying away the coolant flowing through the channel structures, outwardly extending electrical conductors for the electronic components, and a cover layer which forms one of the flat sides and which is made of a heat-conducting, electrically-insulating material; the at least one electronic component being arranged on one of the opposed flat sides of the microcooling device; adjacent microcooling devices being spaced apart from one another with proximate flat sides confronting one another, with the at least one electronic component arranged on one of the flat sides of the microcooling devices; and with at least one of the electronic components on one microcooling device lying in contact with the cover layer of an adjacent microcooling device.

In accordance with a further aspect of the invention, the objects are also achieved by providing a microcooling arrangement comprising a plurality of microcooling devices associated with electronic components, each microcooling device comprising a closed channel through which a coolant passes, outwardly extending fluid lines for respectively supplying and carrying away coolant flowing through the channel structures and outwardly extending electrical conductors for the electronic components, the outwardly extending fluid lines comprising a common coolant supply duct for supplying coolant to a plurality of the channel structures and a common coolant discharge duct for carrying away coolant from the plurality of channel structures, the common coolant supply duct and the common coolant discharge duct being in fluid communication with each other through the plurality of channel structures.

In accordance with the invention, microcooling devices are used which have a construction that facilitates efficient cooling due to the short heat transfer path from the electronic components and assemblies. The heat transfer path extends through only the insulating layer which has good thermal conductivity.

In accordance with an alternative approach, which may advantageously be combined with the arrangement described above, a cooling system is provided which permits the cooling medium to flow parallel through the channel structures of each of a plurality of individual microcooling devices in a housing. The channel structures thus act as cooling means. Preferably, the cooling medium flows parallel through every microcooling device in the housing. In this way it is possible to establish an approximately equal temperature along the flow of all cooling channels.

In contrast thereto, in prior art devices which have a serial flow, the coolant is continuously heated to higher and higher temperatures as it approaches the end of the flow path, so that the electronic components and/or assemblies toward the end of the flow path are less effectively cooled.

Additional advantageous embodiments of the invention will become apparent from a consideration of the following description and claims.

BRIEF DESCRIPTION OF THE DRAWINGS

The invention will be described in further detail hereinafter with reference to illustrative preferred embodiments shown in the accompanying drawings in which.

DETAILED DESCRIPTION OF PREFERRED EMBODIMENTS

Figure 1:
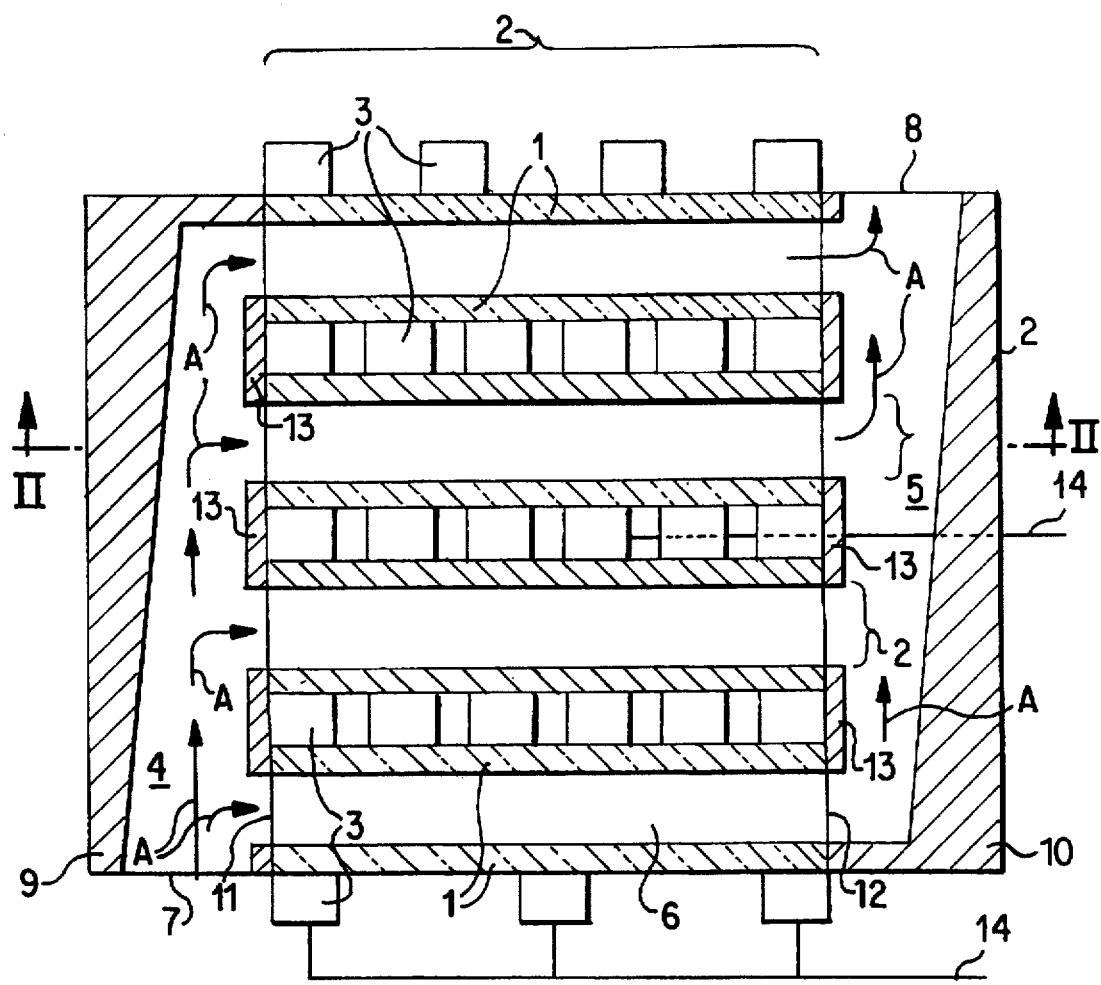
FIG. 1 shows a cross section taken along line I—I of FIG. 2 through a plurality of microcooling devices, transversely through their flat sides.
Figure 2:
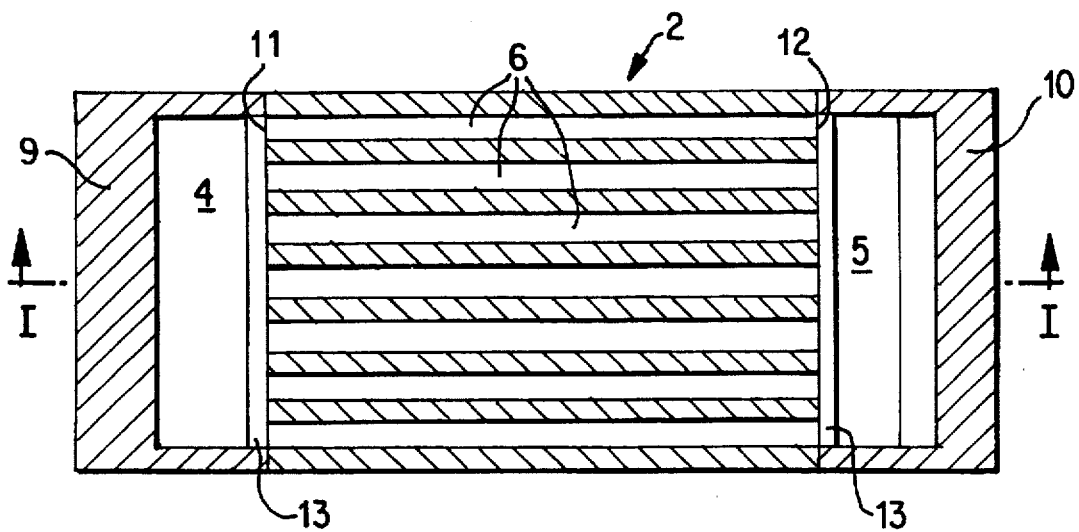
FIG. 2 shows a cross section taken along line II—II of FIG. 1 through a microcooling device parallel to its flat side.

FIG. 1 shows a cross sectional view through a plurality of microcooling devices 2 perpendicular to their flat sides taken along line I—I of FIG. 2. The microcooling devices of the invention can be made of any material which has sufficient structural strength and temperature resistance for the intended application. Preferably the microcooling device of the invention is made of a material on which it is known that diamond can be deposited, for example on diamond (homoepitaxially) or on nickel, silicon, silicon carbide, titanium carbide, molybdenum, steel, tungsten carbide, etc. (heteroepitaxially). Each of the microcooling devices 2 has a channel structure formed by channels 6, this structure being designed to allow a coolant to flow through it. The coolant is preferably water to which especially a substance having a freezing point lowering effect has been added. The coolant may advantageously be a mixture of water and a freezing point lowering substance, for example an aqueous salt solution or a Glysantin™ solution.

The channels 6, and hence the channel structures of the individual microcooling devices, are covered on both sides with a cover layer 1, on the outside of which electronic components 3 are arranged. Outwardly directed electric leads or conductors 14 are provided for connecting the electronic components. The cover layer is made of an electrically insulating and good heat conducting material, for example, diamond. Preferably the cover layer will have a thickness of less than 800 μm, particularly preferably less than 200 μm. The individual microcooling devices 2 are arranged with their flat sides stacked one above the other and have electronic components 3 on both flat sides.

The electronic components 3 disposed on confronting flat sides of adjacent microcooling devices 2 are spaced apart or staggered with respect to one another. In this way it is possible to cool components 3 also at the adjacent microcooling device 2, since the components 3 also are at least partially in contact with the cover layer 1 of the adjacent microcooling device 2.

A good heat dissipation from an electronic component 3 to the microcooling device 2 can be further improved in such microcooling devices 2 if the cover layer 1 is a crystalline layer on which the components 3 are heteroepitaxially deposited. Suitable procedures for such heteroepitaxial deposition are known in the art, for example, from the disclosure of published German Patent Application No. DE 4,333,085. It is especially desirable to arrange the components 3 near to the channels 6 of the individual microcooling devices 2 which form the channel structure.

At the free end faces through which the channels 6 of the channel structures of the microcooling devices 2 open, on one side there is a component or member 9 in which an integral coolant supply duct 4 is formed, and on the opposite side there is a component or member 10 in which an integral coolant discharge duct is formed.

The component 9 with supply duct 4 is sealingly attached to the microcooling devices 2 and so as to be in fluid communication with all of the inlet openings 11 of the individual channels 6 of each channel structure. Similarly, member 10 with collecting duct 5 is sealingly attached to the opposite end face of the microcooling devices 2, so that the collecting or discharge duct 5 is in fluid communication with the outlets of all of the individual channels 6. As a result of this configuration, a common coolant supply channel 4 and a common collector channel 5 are associated with all of the microcooling devices 2, the coolant supply duct 4 and the coolant discharge duct 5 are in fluid communication with each other through the channels 6 of the microcooling devices 2. Members 9 and 10 may advantageously be attached to the base structure in which the channels are formed by soldering with known solders, e.g. conductive silver solder.

Sealing caps 13 are disposed on the supply and collecting ends of the microcooling devices 2, which bridge and seal off the spaces between adjacent microcooling devices 2. This blocks access of the coolant to the components 3 which in some cases might cause an electrical short-circuit.

To improve the flow of coolant by means of a suction effect in the vicinity of the collector duct 5, the inlet opening 7 for the flow of coolant into the supply duct 4 is disposed diametrically opposite the opening 8 through which the coolant exits from the collector duct 5.

The supply duct 4 has an open cross section that diminishes in the direction (arrow A) of flow of the coolant, and the collector duct 5 has an open cross section that expands in the direction (arrow A) of flow of the coolant.

In order that the flow of the coolant through the channel structures of the individual microcooling devices 2 and all of the individual channels 6 of the channel structures may be comparable, thereby providing for the cooling action of each microcooling device 2 to be approximately uniform throughout, the cross-sectional variation of the supply channel 4 and that of the collector channel 5 are coordinated with the entry of the coolant into the channel structures and the flow of the coolant from the channel structures, respectively.

The foregoing description and examples have been set forth merely to illustrate the invention and are not intended to be limiting. Since modifications of the described embodiments incorporating the spirit and substance of the invention may occur to persons skilled in the art, the invention should be construed broadly to include all variations falling within the scope of the appended claims and equivalents thereof.

What is claimed is:

1. A microcooling arrangement comprising a plurality of adjacent microcooling devices each provided with at least one electronic component, each microcooling device having two opposed flat sides and comprising a closed channel structure through which a coolant passes, outwardly extending fluid lines for respectively supplying and carrying away the coolant flowing through the channel structures, outwardly extending electrical conductors for the electronic components, and a cover layer which forms one of the flat sides made of a heat-conducting, electrically-insulating material; wherein:

the at least one electronic component is arranged on one of the opposed flat sides of each microcooling device;

adjacent microcooling devices are spaced apart from one another with proximate flat sides, which have at least one electronic component arranged thereon, confronting one another, and at least one of said electronic components on one microcooling device lies in contact with the cover layer of an adjacent microcooling device.

2. A microcooling arrangement according to claim 1, wherein said cover layer is a crystalline layer of diamond.

3. A microcooling arrangement according to claim 1, wherein the cover layer is a crystalline layer, and the at least one electronic component is a heteroepitaxially deposited electronic component on the cover layer.

4. A microcooling arrangement according to claim 1, wherein said fluid lines comprise a common coolant supply duct for supplying coolant to the channel structures of a plurality of said microcooling devices, and a common coolant discharge duct for carrying away coolant from said channel structures of said plurality of microcooling devices.

5. A microcooling arrangement according to claim 4, wherein said supply duct has a section which decreases in a coolant flow direction, and said discharge duct has a cross section which increases in the coolant flow direction.

6. A microcooling arrangement according to claim 4, wherein said coolant supply duct has an inlet opening disposed diametrically opposite an outlet of said coolant discharge duct on said microcooling arrangement.

7. A microcooling arrangement according to claim 4, wherein said coolant supply duct is formed in a first component and said coolant discharge duct is formed in a second component, said first and second components being sealingly attached to said plurality of microcooling devices adjacent inlets and outlets, respectively, of the channel structures of the microcooling devices.

8. A microcooling arrangement according to claim 7, wherein said first and second components are soldered to said plurality of microcooling devices.

9. A microcooling arrangement according to claim 1, wherein said outwardly extending fluid lines comprise a common coolant supply duct for supplying coolant to a plurality of said channel structures and a common coolant discharge duct for carrying away coolant from said plurality of channel structures, said common coolant supply duct and said common coolant discharge duct being in fluid communication with each other through said plurality of channel structures.

10. A microcooling arrangement according to claim 9, wherein said supply duct has a section which decreases in a coolant flow direction, and said discharge duct has a cross section which increases in the coolant flow direction.

11. A microcooling arrangement according to claim 9, wherein said coolant supply duct has an inlet opening disposed diametrically opposite an outlet of said coolant discharge duct on said microcooling arrangement.

12. A microcooling arrangement according to claim 9, wherein said coolant supply duct is formed in a first component and said coolant discharge duct is formed in a second component, said first and second components being sealingly attached to said plurality of microcooling devices adjacent inlets and outlets, respectively, of the channel structures of the microcooling devices.

13. A microcooling arrangement according to claim 12, wherein said first and second components are soldered to said plurality of microcooling devices.

* * * * *